United States Patent [19]

Yoshida et al.

[11] Patent Number: 4,853,066

[45] Date of Patent: Aug. 1, 1989

[54] METHOD FOR GROWING COMPOUND SEMICONDUCTOR CRYSTAL

[75] Inventors: Seikoh Yoshida; Toshio Kikuta, both of Yokohama; Yuzo Kashiwayanagi, Yokosuka, all of Japan

[73] Assignee: Furukawa Electric Co., Ltd., Tokyo, Japan

[21] Appl. No.: 113,546

[22] Filed: Oct. 26, 1987

[30] Foreign Application Priority Data

Oct. 31, 1986 [JP]  Japan ................................ 61-258309
Jul. 30, 1987 [JP]  Japan ................................ 62-188964

[51] Int. Cl.⁴ ..................... C30B 11/14; C30B 11/00
[52] U.S. Cl. ............................. 156/616.4; 156/616.3; 156/616.1; 23/295 R
[58] Field of Search ............... 156/616.1, 616.2, 616.3, 156/616.4, 616.41; 23/295 R

[56] References Cited

U.S. PATENT DOCUMENTS

| | | | |
|---|---|---|---|
| 3,410,665 | 11/1968 | Muller et al. | 156/616.4 |
| 4,050,905 | 9/1977 | Swinehart | 156/616.4 |
| 4,096,025 | 6/1978 | Caslavsky et al. | 156/616.3 |
| 4,412,577 | 11/1983 | Salkeld et al. | 156/616.3 |

FOREIGN PATENT DOCUMENTS 2459591  7/1975  Fed. Rep. of Germany ... 156/616.3

*Primary Examiner*—John Doll
*Assistant Examiner*—R. Bruce Breneman
*Attorney, Agent, or Firm*—Frishauf, Holtz, Goodman & Woodward

[57] ABSTRACT

A method and an apparatus for growing a crystal of a compound semiconductor, in which a heater, used to heat a boat for growing the semiconductor crystal, is disposed around an ampule containing the boat, and a melt of the compound semiconductor, which is prepared in the boat, is freezed gradually at a predetermined temperature gradient including the freezing point of the melt, from a crystal growth starting end of the boat to a crystal growth terminating end thereof, whereby a single crystal or a polycrystal is grown. At the start of crystal growth, a crystalline nucleus is formed by periodically changing the temperature of the crystal growth starting end of the boat, in descending and ascending modes, within a temperature range lower than the melting point of the compound semiconductor, after once lowering the temperature of the starting end to a level lower than the melting point by means of a heater block opposed to the starting end. The crystal is grown around the crystalline nucleus formed in this manner. Preferably, the temperature change at the crystal growth starting end is slower in the descendng mode than in the ascending mode. The method of the invention may be applied without regard to the use of a seed crystal.

7 Claims, 6 Drawing Sheets

METHOD FOR GROWING COMPOUND SEMICONDUCTOR CRYSTAL

BACKGROUND OF THE INVENTION

The present invention relates to a method for growing a polycrystal or single crystal of a compound semiconductor by using the horizontal crystal growing process.

The horizontal Bridgman method (HB method) and temperature gradient freezing method (GF method) are typical examples of conventional methods for horizontally growing the crystal of a compound semiconductor. In either case, a volatile element (e.g., group V element) is provided on the one end side of a quartz ampule, while a boat containing a fusion element (e.g., group III element) is located on the other end side. The ampule is put horizontally into an electric furnace, which is kept within a predetermined temperature profile. By doing this, the element evaporated at the one end or the low-temperature side of the ampule is dissolved to saturation in the element fused in the other end or the high-temperature side. Thus, a molten compound semiconductor is prepared in the boat. The temperature profile has a temperature-gradient section which includes a melting point MP of the compound semiconductor (freezing point of the melt) between the low- and high-temperature sides.

According to the HB method, the ampule is moved relatively to the electric furnace in a gradual manner, from the high-temperature side to the low-temperature side, whereby the crystal is grown from the one end of the boat toward the other end thereof. According to the GF method, on the other hand, the crystal is grown from the one end of the boat toward the other end thereof by controlling a heater of the electric furnace so that the temperature profile is lowered gradually, starting at the one end side of the high-temperature portion and ending at the other end side thereof.

Meanwhile, in growing a polycrystal by the crystal growing methods described above, the following problems arise depending on the growing conditions. In the case of a polycrystal, the composition of intergranular substances become uneven due to precipitation of impurities or the like. Thus, the more the intergranular substances, that is, the smaller the grain size, the less stable the general composition will be. In order to obtain a polycrystal of a uniform composition, therefore, it is necessary to produce one with a large grain size. No seed is used, however, in growing a polycrystal. If the temperature gradient at a crystal growth starting end is too small, therefore, a crystalline nucleus cannot be easily formed, so that supercooling is liable to be caused. If supercooling takes place, freezing starts suddenly when the temperature is lowered by some degrees from the melting point. In consequence, only a polycrystal of a small grain size can be produced. If the temperature gradient at the crystal growth starting end is made too large, on the other hand, the speed of crystal growth increases. Also in this case, therefore, the grain size of the polycrystal obtained is inevitably small. In forming a polycrystal of InP, for example, inclusions of indium or voids may possibly be caused.

In growing a single crystal of a compound semiconductor in a boat by the conventional horizontal Bridgman method or gradient freezing method, on the other hand, a seed crystal is provided at the front end of the boat, and a melt of the semiconductor in the boat is caused to adhere to the seed crystal. Thereafter, a single crystal is grown from the seed crystal.

If the wettability between the seed and the melt is poor, however, an undesired additional crystalline nucleus will be produced separately, and develop into a polycrystal. Depending on the type of the compound semiconductor (e.g., group II-VI compound semiconductors, such as ZnSe, ZnS, CdTe, ZnTe, HgTe, CdHgTe, etc., and group III-V mixed crystals, such as GaAsP, InGaP, GaAlAs, AlInP, InGaAsP, etc.), moreover, the seed crystal may not be able to be easily obtained. Also, seeding may sometimes be difficult due to problems related to equipment. Conventionally, therefore, a method for growing a single crystal without using any seed crystal has been expected to be developed. However, no such method has hitherto been proposed.

If a crystal is grown with use of a high-cost seed crystal, such as InP, furthermore, the resulting crystal is inevitably high in cost. Thus, if a single crystal can be produced without using any seed crystal, then the cost of the single crystal will be reduced highly effectively.

OBJECT AND SUMMARY OF THE INVENTION

The primary object of the present invention is to provide a method and an apparatus for growing a polycrystal or single crystal of a compound semiconductor, capable of securely growing a satisfactory crystalline nucleus at a crystal growth starting end of a boat, with high stability.

Another object of the invention is to provide a method and an apparatus for securely growing a polycrystal of a compound semiconductor having a large grain size, with high stability.

Still another object of the invention is to provide a method and an apparatus for growing a single crystal of a compound semiconductor, in which the wettability between a seed and a melt solution is improved to prevent polycrystallization of a crystalline nucleus.

A further object of the invention is to provide a method and an apparatus for growing a single crystal of a compound semiconductor, capable of securely growing a crystalline nucleus at the crystal growth starting end of a boat, with high stability, without using any seed crystal.

According to the present invention, there is provided a method for growing a crystal of a compound semiconductor, which comprises steps of preparing a melt of the compound semiconductor in a boat; forming a crystalline nucleus by alternatingly changing the temperature of a crystal growth starting end of the boat, in descending and ascending modes, within a temperature range lower than the melting point of the compound semiconductor, after once lowering the temperature of the starting end to a level lower than the melting point, at the start of crystal growth; and growing the crystal by gradually freezing the melt at a predetermined temperature gradient including the freezing point of the melt, from the crystal growth starting end of the boat to a crystal growth terminating end thereof, after the formation of the crystalline nucleus.

Preferably, the temperature change at the crystal-growth starting end is periodic, and is slower in the descending mode than in the ascending mode.

According to the method of the invention, the crystal may be grown with or without the use of a seed crystal, and may be either a single crystal or a polycrystal.

According to the present invention, moreover, there is provided an apparatus for growing a crystal of a compound semiconductor which comprises an ampule containing a boat for growing the crystal of the compound semiconductor, and a heater around the ampule for heating the boat, and is arranged so that a melt of the compound semiconductor is prepared in the boat, and is then freezed gradually at a predetermined temperature gradient including the freezing point of the melt, from a crystal growth starting end of the boat to a crystal growth terminating end thereof. In this apparatus, the heater is divided into a number of blocks in the longitudinal direction of the ampule, each of the heater blocks being controlled independently in heat generation, that one of the heater blocks opposed to the crystal growth starting end of the boat serving to form a crystalline nucleus by alternatingly changing the temperature of the crystal growth starting end, in descending and ascending modes, within a temperature range lower than the melting point of the compound semiconductor, after once lowering the temperature of the starting end to a level lower than the melting point, at the start of crystal growth.

The heater block opposed to the crystal growth starting end of the boat may be a combination of main heating means and auxiliary heating means or of heating means and cooling means.

In forming a single crystal of the compound semiconductor without the use of a seed crystal, the crystal growth starting end of the boat used is preferably in the form of a groove narrower and shallower than any other portion of the boat, part of the melt of the compound semiconductor in the boat being guided to the groove-shaped starting end.

The above and other objects, features, and advantages of the present invention will be more apparent from the ensuing detailed description taken in connection with the accompanying drawings.

DETAILED DESCRIPTION

Figure 1:
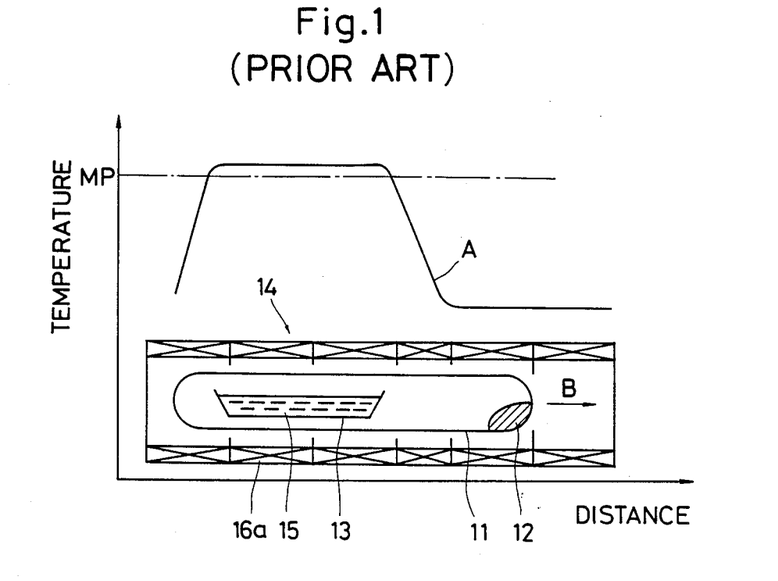
FIG. 1 is a diagram showing a furnace temperature profile obtained along the longitudinal direction of an ampule of a crystal growing apparatus for growing a crystal of a compound semiconductor by the conventional horizontal Bridgman method, the diagram including an outline of the apparatus.

FIG. 1 shows an outline of a semiconductor manufacturing apparatus and a furnace temperature profile used in the conventional horizontal Bridgman method (HB method). A volatile element 12, e.g., a group V element, is disposed inside the one end portion of a cylindrical quartz ampule 11, while a boat 13 containing a fusion element 15, e.g., a group III element, is located inside the other end portion of the ampule. The ampule 11 is put horizontally into an electric furnace 14. The furnace 14 has a heater 16a which is divided longitudinally into a number of blocks, surrounding the ampule 11. The individual blocks of the heater 16a can control the generation of heat independently. The temperature distribution in the furnace is given a predetermined temperature profile A, as illustrated, by the heater blocks. Thus, each position inside the furnace is kept at a predetermined temperature. More specifically, the volatile element 12 inside the one end portion of quartz ampule 11 is kept at a predetermined temperature on the low-temperature side. The fusion element 15 in the boat 13 inside the other end side is kept at a predetermined temperature on the high-temperature side, which is higher than the melting point MP. The aforesaid temperature profile A has a temperature gradient section, which includes the melting point MP of the compound semiconductor between the predetermined predetermined temperatures on the high-and low-temperature sides.

In the conventional HB method described above, a crystal is grown, from the one end of the boat 13 toward the other end, by gradually moving the ampule 11 in the direction of arrow B, or by gradually moving the electric furnace 14 in the opposite direction while keeping the ampule 11 stationary.

Figure 2:
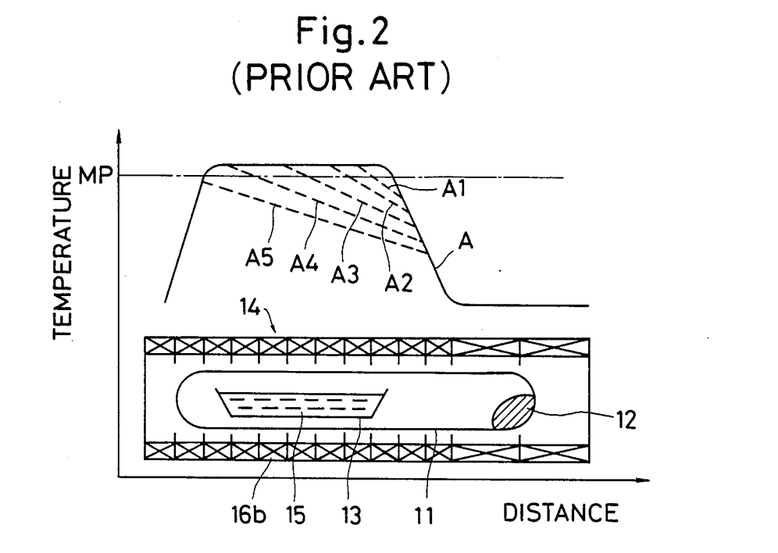
FIG. 2 is a diagram showing a furnace temperature profile obtained along the longitudinal direction of an ampule of a crystal growing apparatus for growing a crystal of a compound semiconductor by the conventional temperature gradient freezing method, the diagram including an outline of the apparatus.

FIG. 2 shows an outline of a semiconductor manufacturing apparatus and a furnace temperature profile used in the conventional temperature gradient freezing method (GF method). The apparatus adapted for this method has basically the same arrangement as the apparatus for the HB method, except that an electric furnace 14 has a heater 16b divided longitudinally into blocks which are greater in number than those for the HB method. In FIGS. 1 and 2, therefore, like reference numerals are used to designate like components.

In the conventional GF method described above, a crystal is grown, from the one end of the boat 13 toward the other end, in the following manner. Instead of moving the ampule 11 relatively to the electric furnace 14, the amount of heat produced by the individual blocks of the heater 16b is controlled so that the furnace temperature profile A is lowered gradually, starting at the one end side of the high-temperature portion and ending at the other end side thereof. In other words, the furnace temperature profile A is changed gradually from a profile A1 to a profile A5, as indicated by broken lines in FIG. 2.

According to the conventional methods for manufacturing compound semiconductors, using the manufacturing apparatuses described above, it is very difficult to control the temperature at the end for the start of crystal growth. In manufacturing polycrystalline semiconductors by means of these apparatuses, only polycrystals of a small grain size (10 mm square or less) can be produced. In manufacturing single-crystal semiconductors, on the other hand, it is difficult to grow single crystals of compound semiconductors without using seed crystals.

Figure 3:
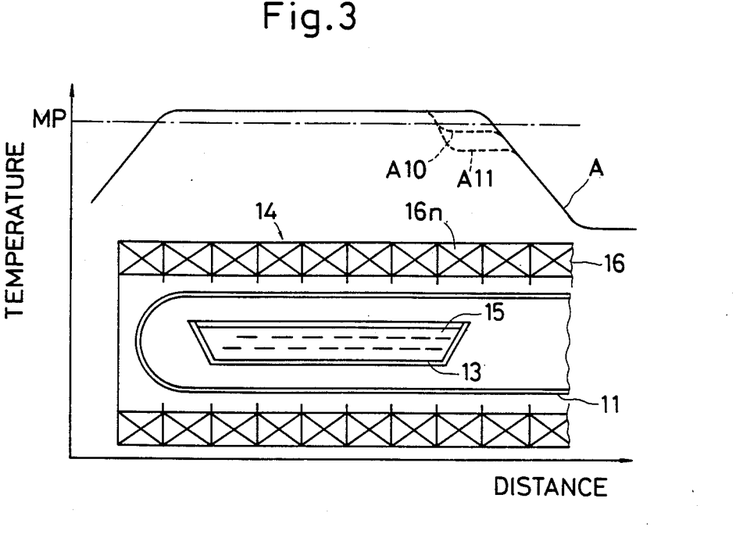
FIG. 3 is a diagram showing a furnace temperature profile obtained along the longitudinal direction of an ampule of a crystal growing apparatus for growing a crystal of a compound semiconductor by a crystal growing method according to the present invention, the diagram including an outline of the apparatus.

FIG. 3 shows a semiconductor manufacturing apparatus according to the present invention. As shown in FIG. 3, a heater 16 of an electric furnace 14 of this apparatus is divided into a number of blocks, in the longitudinal direction of an ampule 11. The individual blocks of the heater 16 can control the generation of heat independently. As in the conventional cases, therefore, the furnace temperature profile A can be obtained by controlling the heater blocks. In particular, the amount of heat produced by a heater block 16n situated corresponding to a crystal-growth starting end of a boat 13 can be controlled so that the temperature at the starting end can be changed periodically. These are the points in which the apparatus of the invention differs from the prior art apparatuses. For the other components, the apparatus of the invention has basically the same arrangement as the conventional apparatuses. In FIGS. 1 to 3, therefore, like reference numerals refer to like components throughout the individual views.

Figure 4:
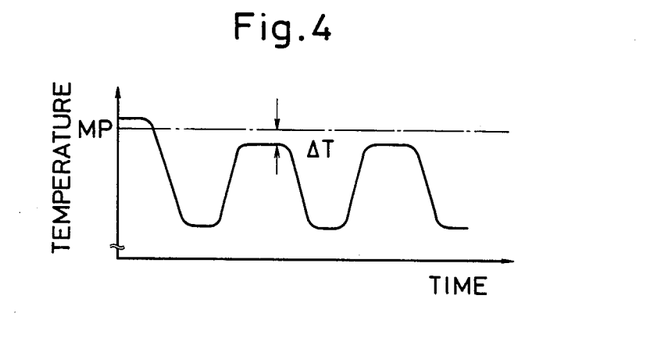
FIG. 4 is a graph showing a periodic time-based temperature change at a crystal growth starting end of a boat used in the crystal growing apparatus of FIG. 3.

By way of example, the manufacture of a polycrystalline semiconductor of InP will be described specifically. First, the furnace temperature profile was adjusted to the profile A, and a melt 15 of InP was kept at a temperature a little higher than the melting point MP, for a predetermined time. In starting crystal growth, thereafter, the amount of heat produced by the heater block 16n, which was opposed to the crystal growth starting end of the boat 13, was controlled so that the furnace temperature profile was periodically changed many times, between profiles A10 and A11, as indicated by broken lines in FIG. 3. Thus, the growth starting end was subjected to a temperature change as shown in FIG. 4, for example. Those temperatures at the peak sections of the curve, indicative of the periodic temperature change, were set so as to be lower than the melting point MP by $\Delta T$, as shown in FIG. 4.

The size and time duration of the temperature change depend on the degree of supercooling (liability to supercooling; proportional to the amount of impurities) of the melt. For example, the temperature amplitude ranges from about 2° to 50° C. and the temperature rise and fall times range from about 5 to 20 minutes and from about 20 to 60 minutes, respectively.

Thereafter, the periodic temperature change was stopped, and a crystal was grown with use of the same temperature profile for the conventional methods. Thus, an InP polycrystal with a large grain size ($4 \times 3$ cm$^2$ or more) was able to be produced with satisfactory reproducibility, by using a relatively small temperature gradient of 4° C./cm, as a result of the periodic temperature change. This indicates that, by periodically changing the temperature at the start of crystal growth, supercooling is restrained, thus permitting formation of a stable crystalline nucleus and steady crystal growth in the vicinity of the melting point, even at a relatively small temperature gradient.

In contrast with the case of growing the polycrystal as described above, a single crystal is grown with a seed disposed at the crystal growth starting end of the boat. If the growth starting end, thus provided with the seed, is subjected to a periodic temperature change, the front end portion of the seed is fused into the melt, thereby ensuring satisfactory wetting between the seed and the melt. Thus, when crystal growth is started, thereafter, the single crystal can be securely grown without being changed into a polycrystal.

Although the growth of a crystal of InP has been described above, the present invention can be also applied to the crystal growth of GaAs.

Figure 5:
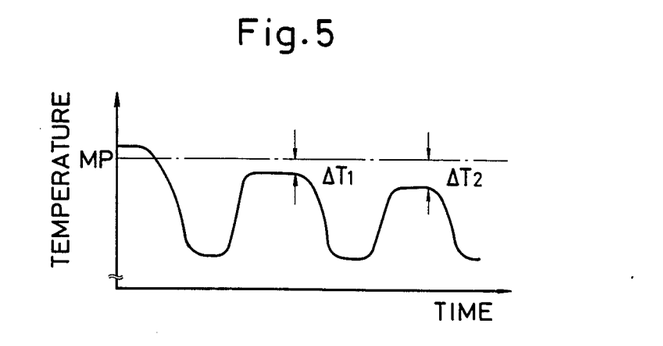
FIG. 5 is a graph, similar to FIG. 4, showing a modification of the periodic time-based temperature change at the crystal growth starting end of the boat used in the crystal growing apparatus of FIG. 3.
Figure 6:
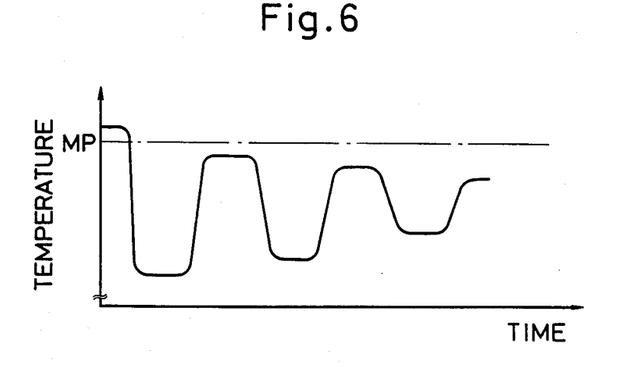
FIG. 6 is a graph, similar to FIG. 4, showing another modification of the periodic time-based temperature change at the crystal growth starting end of the boat used in the crystal growing apparatus of FIG. 3.
Figure 7:
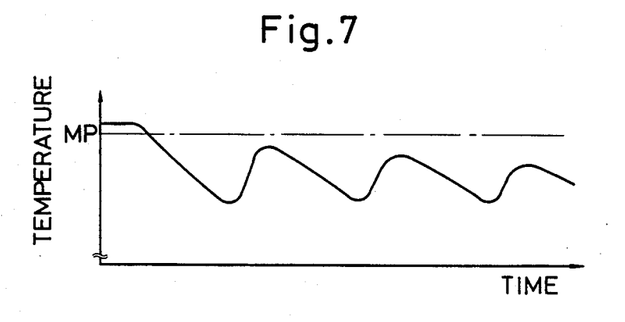
FIG. 7 is a graph, similar to FIG. 4, showing still another modification of the periodic time-based temperature change at the crystal growth starting end of the boat used in the crystal growing apparatus of FIG. 3.

The periodic temperature change may have various other waveforms than the one shown in FIG. 2. In an example shown in FIG. 5, the temperature at the peak section is lowered gradually. In FIG. 6, the temperature amplitude is reduced gradually from both the peak and bottom sections. In FIG. 7, the temperature is changed smoothly at the peak and bottom sections. Thus, the curve of FIG. 7 indicative of the temperature change has no level portion, at the peak or bottom section, over which the temperature is fixed. The selection of the waveform depends on the degree of supercooling of the melt. A melt of a higher degree of supercooling is subjected to a sharper temperature change of a larger amplitude. In other words, a melt of a lower degree of supercooling is subjected to a smoother temperature change of a smaller amplitude. In the cases of the temperature changes shown in FIGS. 5 to 7, moreover, the temperatures at the high-temperature sections are 2° or 3° C. higher than the melting point at the start. In the final stage, however, such temperatures are adjusted to levels 5° to 10 20 C. lower than the melting point.

Figure 8:
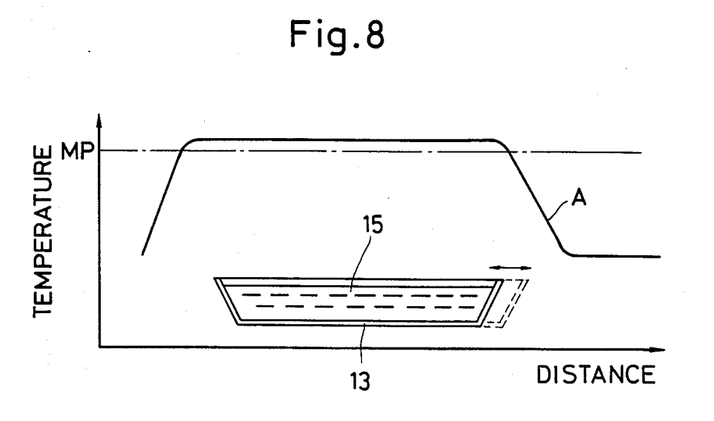
FIG. 8 is a diagram showing the furnace temperature profile obtained along the longitudinal direction of the ampule of the crystal growing apparatus according to the invention, the diagram including an illustration of a modification of an arrangement for subjecting the crystal growth starting end of the boat to the temperature change at the start of crystal growth.

In the arrangement shown in FIG. 3, the periodic temperature change is obtained by changing the amount of heat produced by the heater block 16n at the crystal growth starting end. Besides this method, there is a method in which the boat 13, with the melt 15 therein, is repeatedly moved back and forth (together with the ampule (not shown)), with the profile A maintained as the furnace temperature profile, as shown in FIG. 8.

Figure 9:
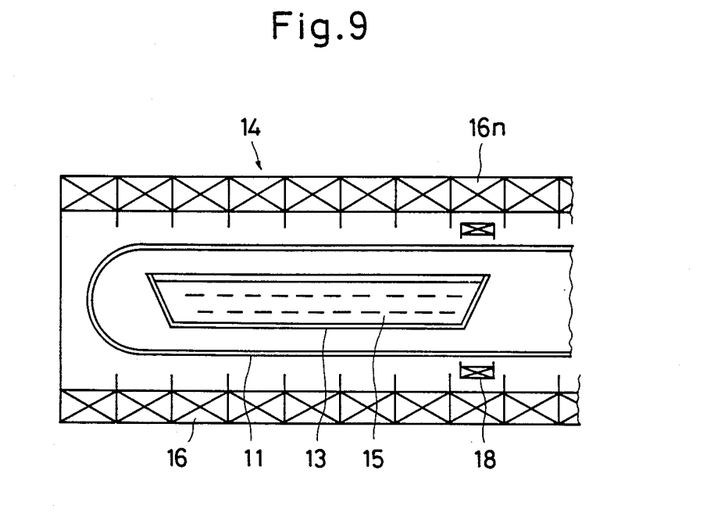
FIG. 9 is a partial sectional view of a heater including a heater block for subjecting the crystal growth starting end of the boat to the temperature change at the start of crystal growth, showing a modification of the arrangement of FIG. 3.
Figure 10:
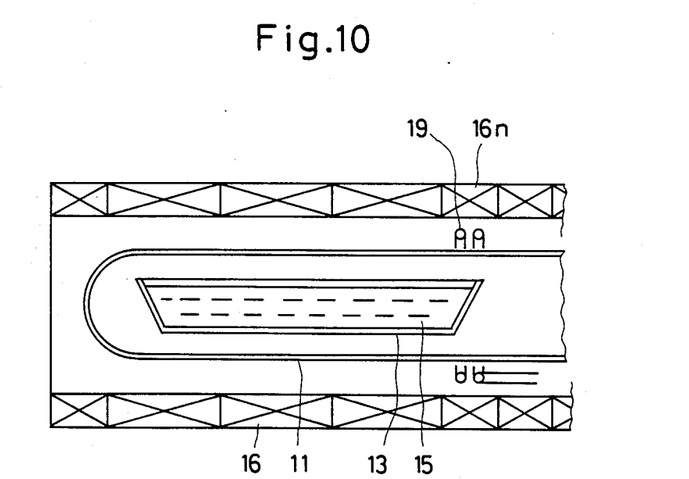
FIG. 10 is a partial sectional view, similar to FIG. 9, of a heater including a heater block for subjecting the crystal growth starting end of the boat to the temperature change at the start of crystal growth, showing another modification of the arrangement of FIG. 3.

FIGS. 9 and 10 show alternative crystal growing apparatuses for effecting the method of the present invention. In these apparatuses, a heater 16, which constitutes an electric furnace 14, is disposed around an ampule 11 which contains a boat 13 filled with a melt 15 of a compound semiconductor. In order to produce a necessary temperature profile for crystal growth, the heater 16 is divided longitudinally into a number of blocks in the longitudinal direction of the ampule 11. Thus, the amounts of heat generated from the individual heater blocks can be controlled independently.

The apparatus shown in FIG. 9 is constructed so that auxiliary heating means 18, used to produce a periodic temperature change, is located inside a main heater block 16n which is situated corresponding to the crystal growth starting end of the boat 13. In this apparatus, the heater 16 and the auxiliary heating means 18 are used to produce the aforesaid necessary temperature profile A. At the start of crystal growth, the amount of heat generated from the auxiliary heating means 18 is changed to produce the periodic temperature change. In such an arrangement, the temperature at the crystal growth starting end can be controlled more finely, so that the periodic temperature change can be produced easily and accurately.

The apparatus shown in FIG. 10 is constructed so that cooling means 19, such as a cooling gas pipe, is located inside a heating block 16n which is situated corresponding to the crystal growth starting end of the boat 13. In this apparatus, the heater 16 is used to produce the aforesaid necessary temperature profile A. At the start of crystal growth, the amount of heat absorbed by the cooling means 19 is changed to produced the periodic temperature change. Thus, the same effect of the arrangement shown in FIG. 9 can be obtained.

Figure 11:
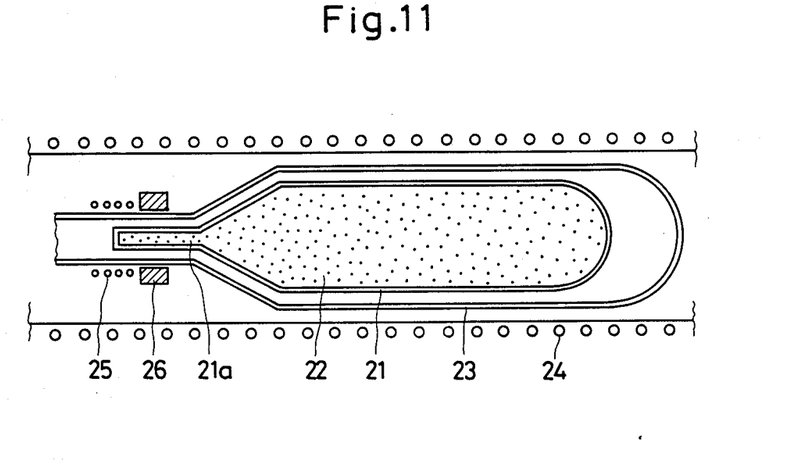
FIG. 11 is a partial horizontal sectional view showing an outline of an apparatus for growing a crystal of a compound semiconductor according to an alternative embodiment of the invention.
Figure 12:
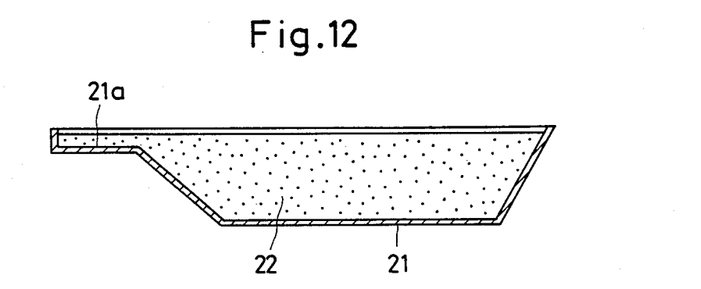
FIG. 12 is a vertical sectional view of a boat used in the apparatus of FIG. 11.

FIGS. 11 and 12 show a semiconductor manufacturing apparatus according to an alternative embodiment of the present invention. This apparatus is adapted to grow a single-crystal compound semiconductor without using any seed as a crystalline nucleus. In this apparatus, a boat 21 containing a melt 22 of a compound semiconductor is sealed in a quartz ampule 23, and the melt 22 in the boat 21 is heated by means of a heater 24 of an electric furnace.

A narrow and shallow straight groove 21a is formed at the front end portion of the boat 21. Part of the compound semiconductor melt 22 in the boat 21 fills the groove 21a. The groove 21a is about 5 mm wide, 5 mm deep, and 3 to 5 cm long, for example. The intermediate portion of the boat 21 has a width of about 5 to 6 cm and a depth of about 3.5 to 4.5 cm, for example. The elongated groove 21a, thus provided at the front end portion of the boat 21, facilitates a crystalline nucleus to be produced at the boat end portion at the start of crystal growth.

Also, a local heater 25 is located around that portion of the quartz ampule 23 which corresponds to the front end portion of the boat 21. The heater 25 serves to subject the melt 22 in the groove 21a to a temperature fluctuation. The temperature fluctuation is produced by adjusting the output of the local heater 25. In order to allow only the front end portion of the boat 21 to be subjected to the temperature fluctuation, that portion of the ampule 23 corresponding to the boat end portion is narrowed down as illustrated. The heater 25 surrounds the narrowed portion. The influence of the temperature fluctuation can be effectively avoided by locating an adiabatic member 26 adjacent to the local heater 25, as shown in FIG. 11.

Figure 13:
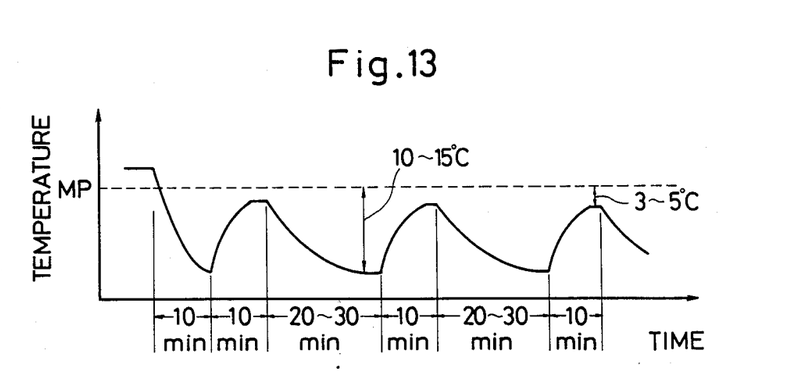
FIG. 13 is a graph showing a time-based temperature change obtained at a crystal growth starting end of the boat of the crystal growing apparatus of FIGS. 11 and 12 at the start of crystal growth.

The temperature fluctuation is given in such a pattern as is shown in FIG. 13. Initially, the melt 22 in the groove 21a is kept at a temperature a little higher than the melting point MP. The temperature of the melt 22 is lowered to a level 10° to 15° C. lower than the melting point MP, in about 10 minutes, by reducing the output of the local heater 25. Thereupon, several crystalline nuclei are produced in the melt 22. Then, the output of the heater 25 is increased to raise the temperature to a level 3° to 5° C. lower than the melting point MP, in about 10 minutes. As a result, relatively small ones of the crystalline nuclei in the melt 22 dissolve and lessen in number. Subsequently, the temperature is lowered again to the level 10° to 15° C. lower than the melting point MP, in about 20 to 30 minutes. The temperature is lowered or changed thus slowly this time in order to prevent production of new crystalline nuclei.

A single crystalline nucleus can be obtained after several cycles of repeated rise and fall of the temperature. At this point of time, the melt temperature is kept at a temperature about 5° C. lower than the melting point Mp. Thus, the temperature fluctuation is stopped. Thereafter, a single crystal is grown by the horizontal Bridgman method or temperature gradient freezing method, in the same manner as the conventional way of crystal growth using a seed crystal.

Figure 14:
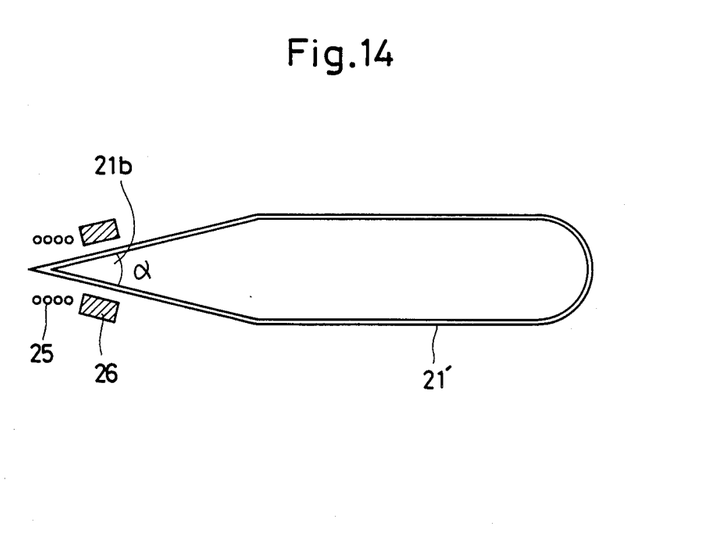
FIG. 14 is a horizontal sectional view showing a modification of the shape of the crystal growth starting end of the boat used in the apparatus of FIG. 11.
Figure 15:
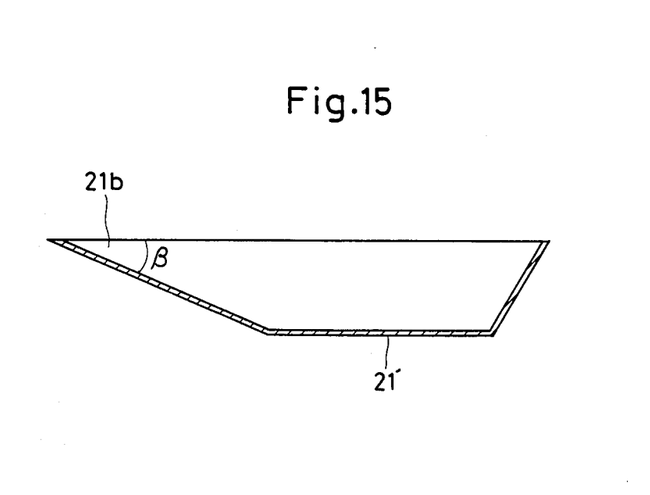
FIG. 15 is a vertical sectional view of the boat shown in FIG. 14.

In the embodiment shown in FIGS. 11 and 12, the straight groove is formed at the front end portion of the boat. Instead of this groove, a sharp groove 21b, which is reduced gradually in both width and depth with distance from the middle portion of the boat 21, may be formed at the front end portion of the boat 21, as shown in FIGS. 14 and 15. Preferably, the respective angles α and β of the width and depth of the tapered groove are 30° or less. In growing a single crystal of InP, for example, it is said to be hard to produce a twin crystal by the pull-up method, using the (111)surface of a seed crystal as the seed surface, if the angle α or β is not wider than 19.5°. Also in the boat method, the aforesaid angles should preferably be made narrow enough.

In the embodiment described above, the local heater is used to produce the temperature fluctuation. Instead of using the local heater, however, a cooling gas pipe of the same type as shown in FIG. 10 is disposed so that the temperature fluctuation can be produced by adjusting the amount of gas flowing through the pipe.

What is claimed is:

1. A method for growing a crystal of a compound semiconductor, comprising steps of:
   preparing a melt of the compound semiconductor in a boat having two ends, one end being a crystal growth starting end and the other end being a crystal growth terminating end, by heating said component semiconductor in said boat to at least the melting point of said compound semiconductor;
   then forming a crystalline nucleus by first lowering the temperature of said melt only at said crystal growth starting end of said boat to a temperature lower than said melting point, while maintaining the temperature of the rest of said melt above said melting point, at the start of crystal growth; and thereafter alternatingly changing the temperature of said melt only at said crystal growth starting end of said boat, in descending and ascending modes, in order to minimize formation of additional crystaline nuclei within a temperature range which is lower than said melting point of said compound semiconductor, while maintaining the temperature of the rest of said melt above said melting point, the upper temperature of said temperature range being below said melting point; and then growing the crystal by gradually freezing said melt at a temperature gradient including the freezing point of said melt from said crystal growth starting end of said boat to said crystal growth terminating end thereof, after the formation of said crystalline nucleus.

2. A method for growing a crystal of a compound semiconductor according to claim 1, wherein the temperature at said crystal growth starting end is periodically during the descending and ascending change modes.

3. A method for growing a crystal of a compound semiconductor according to claim 1, wherein the temperature at said crystal growth starting end changed more slowly in said descending mode than in said ascending mode.

4. A method for growing a crystal of a compound semiconductor according to claim 1, wherein said crystalline nucleus is grown around a seed crystal located at said crystal growth starting end.

5. A method for growing a crystal of a compound semiconductor according to claim 1, wherein said crystalline nucleus is grown without locating a seed crystal at said crystal growth starting end.

6. A method for growing a crystal of a compound semiconductor according to claim 1, wherein a single crystal is grown.

7. A method for growing a crystal of a compound semiconductor according to claim 1, wherein a polycrystal is grown.

* * * * *